(12) United States Patent
Kanaya

(10) Patent No.: US 8,969,983 B2
(45) Date of Patent: Mar. 3, 2015

(54) SEMICONDUCTOR STORAGE DEVICE AND MANUFACTURING METHOD THEREOF

(75) Inventor: Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/425,067

(22) Filed: Mar. 20, 2012

(65) Prior Publication Data

US 2013/0015541 A1  Jan. 17, 2013

(30) Foreign Application Priority Data

Jul. 11, 2011 (JP) ................................. 2011-152788

(51) Int. Cl.
| | |
|---|---|
| *H01L 29/82* | (2006.01) |
| *G11C 11/00* | (2006.01) |
| *H01L 43/12* | (2006.01) |
| *H01L 43/08* | (2006.01) |
| *H01L 27/22* | (2006.01) |
| *H01L 21/00* | (2006.01) |

(52) U.S. Cl.
CPC ................ *H01L 43/12* (2013.01); *H01L 43/08* (2013.01); *H01L 27/226* (2013.01)
USPC ......... 257/421; 257/E21.665; 438/3; 365/158

(58) Field of Classification Search
None
See application file for complete search history.

(56) References Cited

U.S. PATENT DOCUMENTS

| | | | | |
|---|---|---|---|---|
| 6,929,957 B2 * | 8/2005 | Min et al. | ............................ | 438/3 |
| 7,374,952 B2 * | 5/2008 | Kasko et al. | ...................... | 438/3 |
| 7,449,345 B2 * | 11/2008 | Horng et al. | ....................... | 438/3 |
| 7,535,755 B2 * | 5/2009 | Umehara et al. | ............... | 365/158 |
| 7,863,173 B2 * | 1/2011 | Kang et al. | ..................... | 438/584 |
| 8,357,982 B2 * | 1/2013 | Kajiyama | ...................... | 257/421 |
| 8,378,330 B2 * | 2/2013 | Horng et al. | ....................... | 257/2 |
| 8,404,367 B2 * | 3/2013 | Horng et al. | .................. | 428/811 |
| 8,477,531 B2 * | 7/2013 | Yu et al. | ......................... | 365/173 |
| 8,482,966 B2 * | 7/2013 | Kang et al. | ..................... | 365/158 |

(Continued)

FOREIGN PATENT DOCUMENTS

| | | |
|---|---|---|
| CN | 101621113 | 1/2010 |
| JP | 2006-261592 | 9/2006 |

(Continued)

OTHER PUBLICATIONS

Chinese Office Action for corresponding Chinese Patent Application No. 2012100700531, dated Feb. 8, 2014, in 15 pages.

(Continued)

*Primary Examiner* — Hoang-Quan Ho
(74) *Attorney, Agent, or Firm* — Knobbe, Martens, Olson & Bear LLP

(57) ABSTRACT

A memory includes a semiconductor substrate. Cell transistors are on the substrate. Contact plugs each of which is buried between the adjacent cell transistors and electrically connected to a diffusion layer between the adjacent cell transistors. An interlayer dielectric film buries gaps between the contact plugs. A storage element is provided not above the contact plugs but above the interlayer dielectric film. A sidewall film covers a part of a side surface of the storage element, and is provided to overlap with one of the contact plugs as viewed from above a surface of the semiconductor substrate. A lower electrode is provided between a bottom of the storage element and the interlayer dielectric film and between the sidewall film and one of the contact plugs, and electrically connects the storage element to one of the contact plugs.

12 Claims, 12 Drawing Sheets

(56) References Cited

U.S. PATENT DOCUMENTS

| | | |
|---|---|---|
| 8,531,875 B2* | 9/2013 | Yanagi et al. ............... 365/158 |
| 2001/0034106 A1* | 10/2001 | Moise et al. ................ 438/396 |
| 2005/0276099 A1* | 12/2005 | Horng et al. ............... 365/158 |
| 2005/0280040 A1* | 12/2005 | Kasko et al. ................ 257/213 |
| 2006/0220084 A1* | 10/2006 | Umehara et al. ............ 257/296 |
| 2007/0181964 A1 | 8/2007 | Shoji |
| 2007/0241410 A1* | 10/2007 | Umehara et al. ............ 257/379 |
| 2009/0085132 A1* | 4/2009 | Kao et al. ................... 257/421 |
| 2009/0246557 A1* | 10/2009 | Horng et al. ............. 428/811.1 |
| 2010/0003767 A1* | 1/2010 | Cho .............................. 438/3 |
| 2011/0037108 A1 | 2/2011 | Sugiura et al. |
| 2011/0044096 A1* | 2/2011 | Li ............................... 365/158 |
| 2012/0007196 A1* | 1/2012 | Natori et al. ................ 257/421 |
| 2012/0058575 A1* | 3/2012 | Horng et al. .................... 438/3 |

FOREIGN PATENT DOCUMENTS

| | | |
|---|---|---|
| JP | 2007-214229 | 8/2007 |
| JP | 2011-040580 | 2/2011 |

OTHER PUBLICATIONS

Japanese Office Action for corresponding Japanese Application No. 2011-152788, mailed Sep. 24, 2014, in 6 pages.

Chinese Office Action for corresponding Chinese Application No. 201210070053.1, mailed Sep. 3, 2014, in 15 pages.

* cited by examiner

SEMICONDUCTOR STORAGE DEVICE AND MANUFACTURING METHOD THEREOF

CROSS REFERENCE TO RELATED APPLICATIONS

This application is based upon and claims the benefit of priority from the prior Japanese Patent Application No. 2011-152788, filed on Jul. 11, 2011; the entire contents of which are incorporated herein by reference.

FIELD

The embodiments of the present invention relate to a semiconductor device and manufacturing method thereof.

BACKGROUND

A magnetic random access memory (MRAM) is a type of a resistance change memories. As techniques for writing data to an MRAM, there have been known magnetic field writing and spin-transfer torque writing are known. Among these techniques, the spin-transfer torque writing has advantages in higher integration, lower power consumption, and higher performance because of the property of a spin-transfer torque device that a spin injection current is smaller in an amount for magnetization reversal as magnetic bodies become smaller in size.

A spin-transfer torque MTJ (Magnetic Tunnel Junction) element has a stacked structure in which a nonmagnetic barrier layer (an insulating thin film) is sandwiched between two ferromagnetic layers, and stores therein data by a change in a magnetic resistance caused by spin-polarized tunneling. The MTJ element can be switched into a low resistance state or a high resistance state depending on the magnetization orientations of the two ferromagnetic layers. The MTJ element is in a low resistance state when the magnetization orientations of the two ferromagnetic layers are in a parallel state (P state), and in a high resistance state when the magnetization orientations thereof are in an anti-parallel state (AP state).

As for the MRAM of this type, it has been desired to realize mass storage, improved performance, and cost reduction as a result of downscaling. Along with the progress of downscaling, the aspect ratio of contact holes increases, and seams or voids tend to occur in contact plugs made of metal more frequently. When an MTJ element is formed on a contact plug having seams or voids, stepped parts resulting from the seams or voids are sometimes formed in the MTJ element. These stepped parts in the MTJ element cause degradation in characteristics of the MTJ elements.

DETAILED DESCRIPTION

A semiconductor storage device according to the present embodiment includes a semiconductor substrate. A plurality of cell transistors are provided on the semiconductor substrate. A plurality of contact plugs each of which is buried between the adjacent cell transistors and electrically connected to a diffusion layer between the adjacent cell transistors. An interlayer dielectric film buries gaps between a plurality of the contact plugs. A storage element is provided not above the contact plugs but above the interlayer dielectric film. A sidewall film covers at least a part of a side surface of the storage element, and is provided to overlap with one of the contact plugs as viewed from above a surface of the semiconductor substrate. A lower electrode is provided between a bottom of the storage element and the interlayer dielectric film and between the sidewall film and one of the contact plugs, and electrically connects the storage element to one of the contact plugs.

Embodiments will now be explained with reference to the accompanying drawings. The present invention is not limited to the embodiments.

The following embodiments can be used for various types of memories such as an MRAM (magnetic random access memory), an ReRAM (resistance random access memory), a PRAM (phase-change random access memory), and an FeRAM (ferroelectric random access memory). In the following embodiments, the MRAM is described as an example of the resistance change memory. The MRAM includes MTJ elements using the TMR (tunneling magnetoresistive) effect as storage elements, and stores therein information according to magnetization states of these MTJ elements. To rewrite data, spin-transfer torque writing can be used. The spin-transfer torque writing is a technique for directly rewriting the magnetization state of each MTJ element by carrying polarized electrons to the magnetization orientation of which is offset to one side.

First Embodiment

Figure 1:
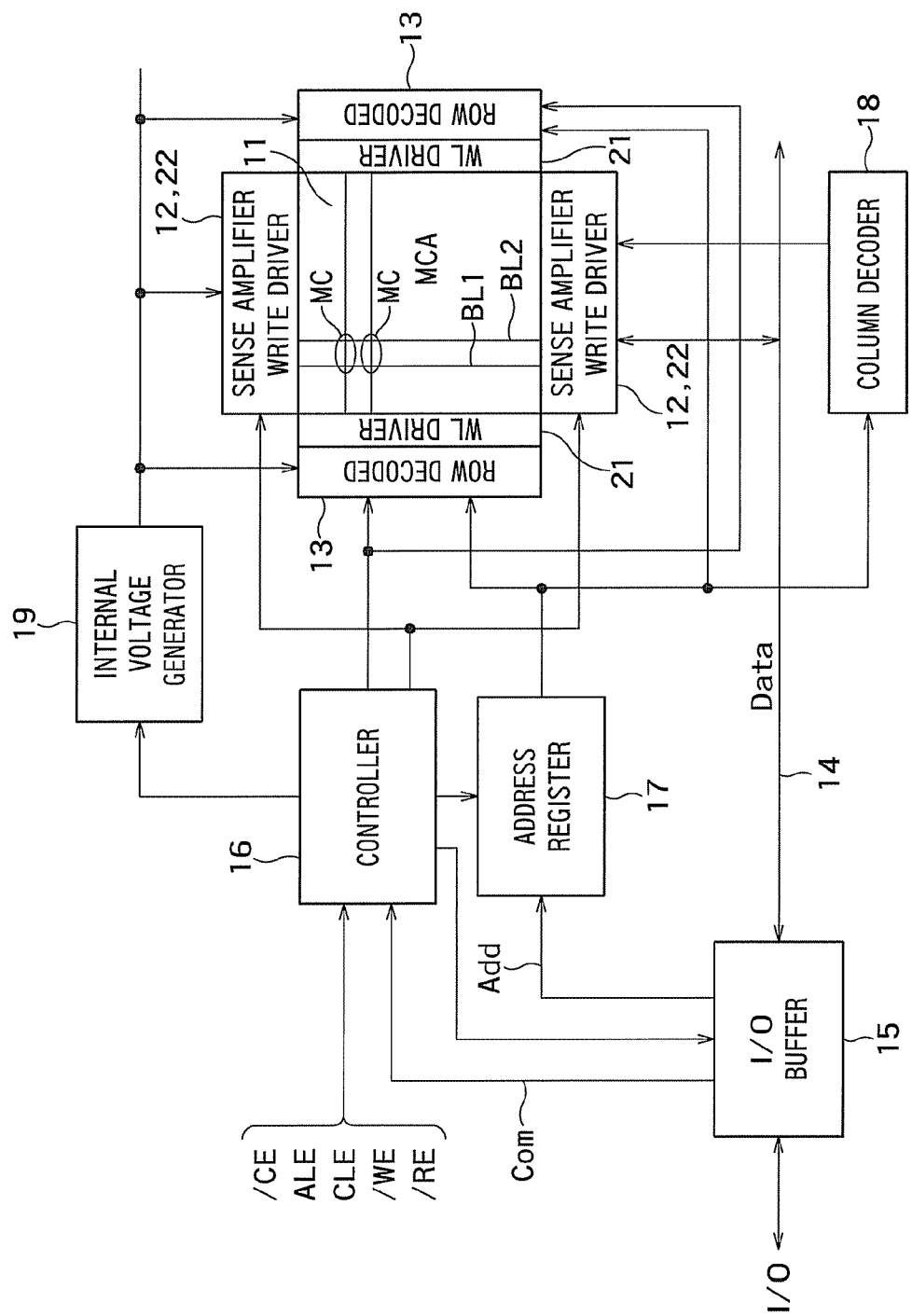
FIG. 1 is a block diagram showing a configuration of an MRAM according to a first embodiment.

FIG. 1 is a block diagram showing a configuration of an MRAM according to a first embodiment. A plurality of memory cells MC are arranged two-dimensionally in a matrix in a memory cell array 11. Each of the memory cells MC includes an MTJ element and a cell transistor CT. The MTJ element is a magnetic tunnel junction element that stores therein data by the change in a resistance state and the data of which can be written by a current. The cell transistor CT is provided to correspond to the MTJ element and configured to become conductive when a current flows to the corresponding MTJ element.

A plurality of word lines WL extend in a row direction and a plurality of bit lines BL extend in a column direction so that the word lines WL and the bit lines BL intersect one another. Two adjacent bit lines BL are paired, and the memory cells MC are provided to correspond to intersections between the word lines WL and pairs of bit lines BL (for example, a first bit line BL1 and a second bit line BL2), respectively. The MTJ element and the cell transistor CT of each memory cell MC are connected in series between the paired bit lines BL (for example, BL1 and BL2). A gate of the cell transistor CT is connected to one word line WL.

Sense amplifiers 12 and write drivers 22 are arranged on each side of the memory cell array 11 in the direction of the bit lines BL, that is, column direction. The sense amplifiers 12 are connected to the bit lines BL and read data stored in the memory cells MC connected to a selected word line WL by detecting a current flowing to the memory cells MC. The write driver 22 is connected to the bit lines BL and writes data to the memory cells MC connected to the selected word line WL by carrying the current to the memory cells MC.

A row decoder 13 and a word line driver 21 are arranged on each side of the memory cell array 11 in the direction of the word lines WL, that is, row direction. The word line driver 21 is connected to the word lines WL and configured to apply a voltage to the selected word line WL during a data reading operation or a data writing operation.

Data is transmitted or received between the sense amplifiers 12 or the write drivers 22 and an external input/output terminal I/O via a data bus 14 and an I/O buffer 15.

Various external control signals such as a chip enable signal /CE, an address latch enable signal ALE, a command latch enable signal CLE, a write enable signal /WE, and a read enable signal /RE are input to a controller 16. The controller 16 identifies an address Add and a command Com supplied from the input/output terminal I/O in response to these control signals. The controller 16 then transfers the address Add to the row decoder 13 and a column decoder 18 via an address register 17. In addition, the controller 16 decodes the command Com. Each sense amplifier 12 is configured to be able to apply a voltage to one bit line BL in response to a column address decoded by the column decoder 18. Each word line driver 21 is configured to be able to apply a voltage to the selected word line WL in response to a row address decoded by the row decoder 13.

The controller 16 controls sequences of data reading, data writing, and data erasing in response to the external control signals and the command. An internal voltage generator 19 is provided to generate internal voltages (such as a boosted voltage stepped up from a power supply voltage) necessary for respective operations. The controller 16 also controls the internal voltage generator 19 to perform a voltage boosting operation so as to generate necessary voltages.

Figure 2:
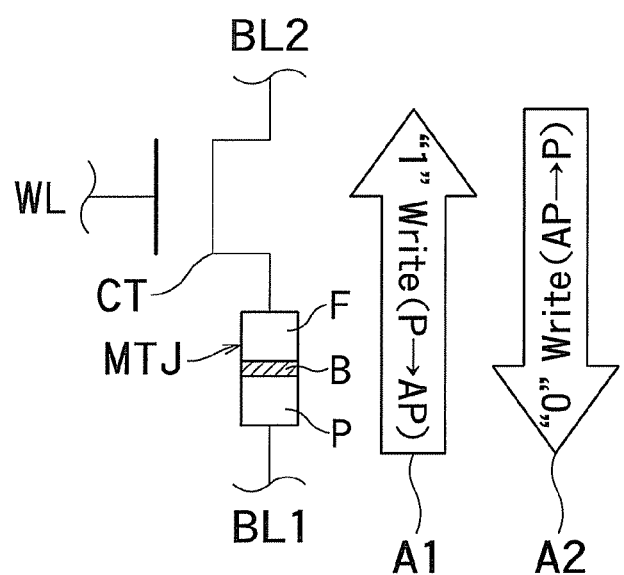
FIG. 2 is an explanatory diagram showing a data writing operation for writing data to one memory cell MC.

FIG. 2 is an explanatory diagram showing a data writing operation for writing data to one memory cell MC. The MTJ element that uses the TMR effect has a stacked structure in which a nonmagnetic layer (insulating film) B is sandwiched between two ferromagnetic layers F and P. The MTJ element stores therein digital data by the change in a magnetic resistance due to the spin-polarized tunneling. The MTJ element can be set in a low resistance state or a high resistance state depending on magnetization orientations of the two ferromagnetic layers F and P. For example, when it is defined that the low resistance state indicates data "0" and that the high resistance state indicates data "1", one-bit data can be recorded in the MTJ element. Needless to say, it can be defined that the low resistance state indicates data "1" and that the high resistance state indicates data "0".

For example, the MTJ element is configured to stack the pinned layer P, the tunnel barrier film B, and the recording (free) layer F in this order. The pinned layer P and the free layer F are made of a ferromagnetic body and the tunnel barrier film B is an insulating film (which is made of $AL_2O_3$ or MgO, for example). The pinned layer P has a fixed magnetization orientation, and the free layer F has a variable magnetization orientation. The MTJ element stores therein data depending on the magnetization orientation of the free layer F.

At the time of the data writing operation, when a current equal to or higher than a write threshold current flows to the MTJ element in an arrow A1 direction, the magnetization orientation of the free layer F becomes anti-parallel to that of the pinned layer P. The MTJ element thereby turns into the high resistance state (data "1"). At the time of the data writing operation, when the current equal to or higher than the write threshold current flows to the MTJ element in an arrow A2 direction, the magnetization orientation of the free layer F becomes parallel to that of the pinned layer P (P state). The MTJ element thereby turns into the low resistance state (data "0"). In this way, different data can be written to the MTJ element depending on the current flow direction.

The positional relation between the pinned layer P and the free layer F can be set opposite to that shown in FIG. 2. In this case, data can be written to the MTJ element by making current flow directions opposite to those described above.

Figure 3:
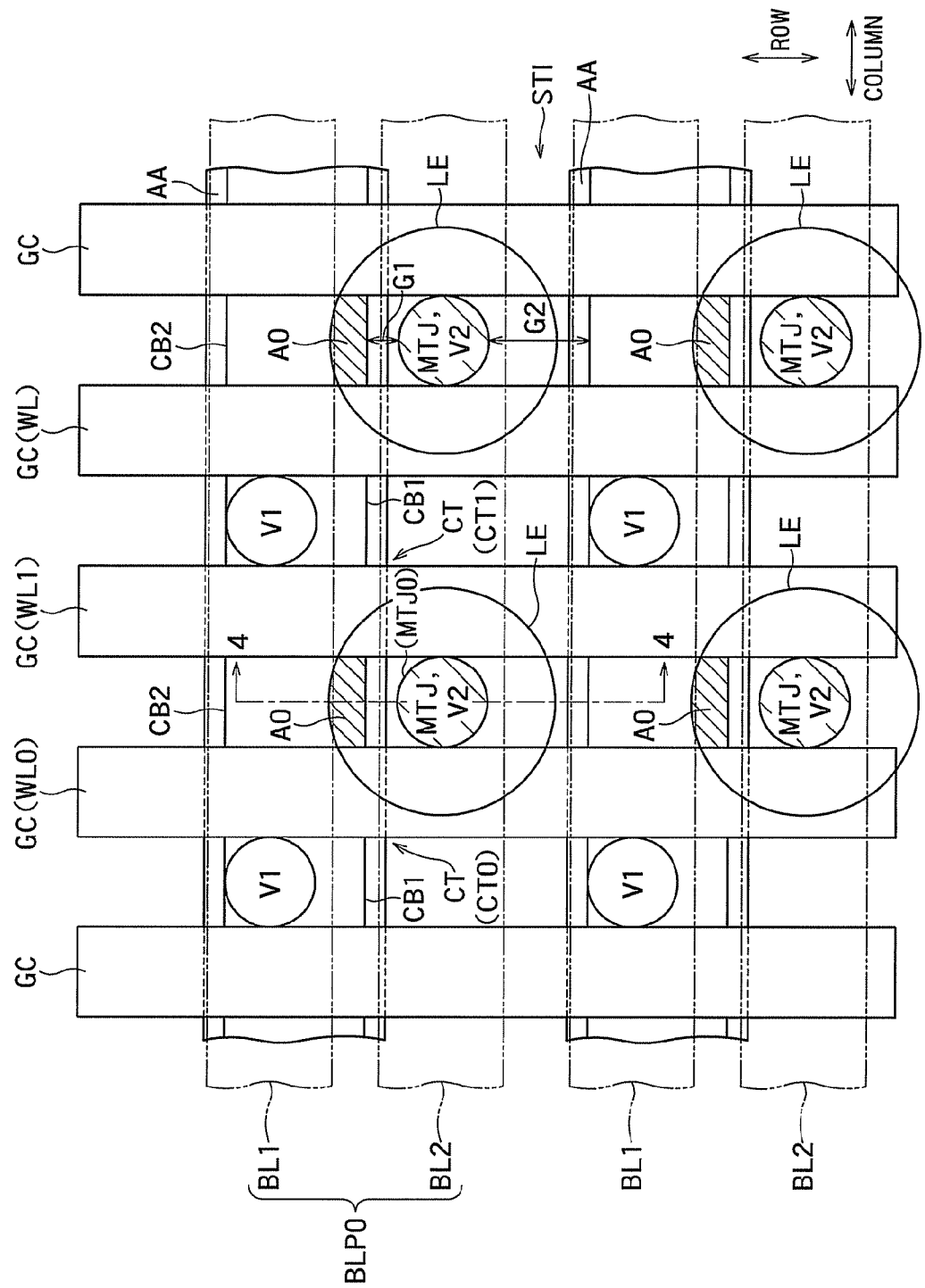
FIG. 3 is a partial plan view of the memory cell array 11 in the MRAM according to the first embodiment.
Figure 4A:
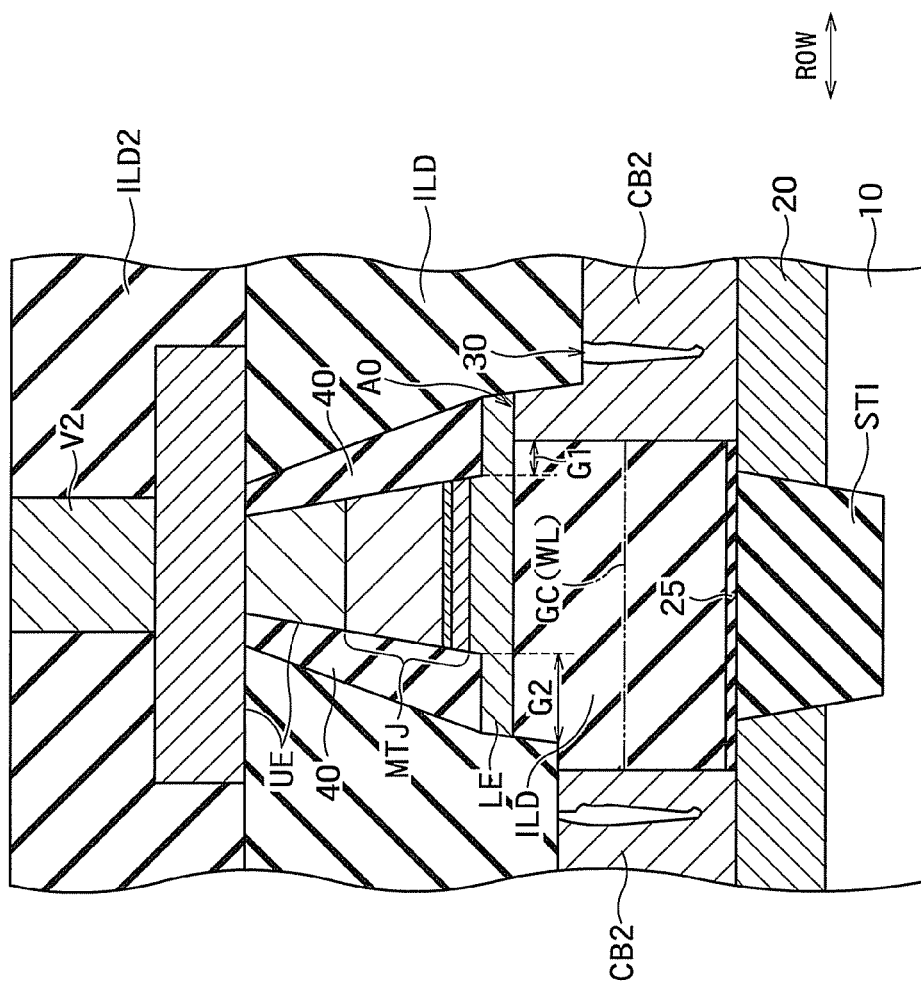
FIGS. 4A and 4B are cross-sectional views taken along a line 4-4 of FIG. 3.
Figure 4B:
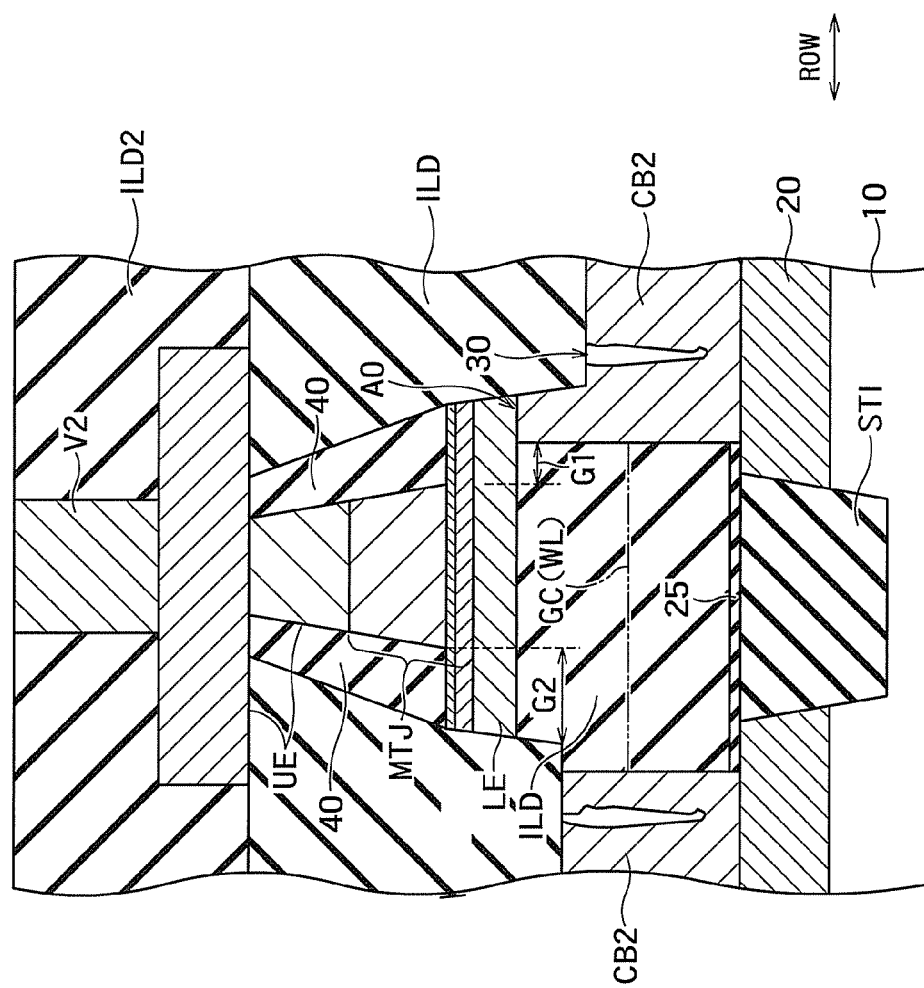

FIG. 3 is a partial plan view of the memory cell array 11 in the MRAM according to the first embodiment. FIGS. 4A and 4B are cross-sectional views taken along a line 4-4 of FIG. 3. As shown in FIG. 3, the MRAM according to the first embodiment includes active areas AA, the word lines WL (gate electrodes GC), pairs of bit lines BL1 and BL2, contact plugs CB (CB1 and CB2), and the central transistors CT.

A plurality of adjacent active areas AA are isolated from one another by element isolation regions STI (Shallow Trench Isolation) formed on a semiconductor substrate 10. The word lines WL extend in the row direction and function as the gate electrodes GC of the respective cell transistors CT. Alternatively, the word lines WL are connected to the gate electrodes GC of the respective cell transistors CT. The pairs of bit lines BL1 and BL2 extend in the column direction orthogonal to the word lines WL.

Each of the MTJ elements is provided to correspond to the intersection between the two adjacent word lines WL and the paired bit lines BL1 and BL2. The MTJ elements are arranged two-dimensionally in a matrix above the semiconductor substrate 10.

Each of the contact plugs CB1 is provided to electrically connect diffusion layers one of diffusion layers formed in the active area AA to a via contact V1. The via contact V1 electrically connects the contact plug CB1 to the bit line BL1. The bit line BL1 is thereby connected to one of the diffusion layers (a source or a drain) of each cell transistor CT via the via contact V1 and the contact plug CB1. Meanwhile, each of the contact plugs CB2 electrically connects the other diffusion layer (a drain or a source) of each cell transistor CT to a lower electrode LE. The contact plug CB2 is connected to the lower electrode LE in an overlapping area A0 shown in FIG. 3.

A lower end of each MTJ element is electrically connected to the contact plug CB2 via the lower electrode LE. The lower electrode LE overlaps with one of the two contact plugs CB2 adjacent in the row direction in the overlapping area A0, and is connected to the one contact plug CB in the overlapping area A0. Therefore, the lower end of the MTJ element is connected to the contact plug CB2 via the lower electrode LE and also connected to the other diffusion layer of the cell transistor CT via the contact plug CB2. Meanwhile, an upper end of the MTJ element is electrically connected to the bit line BL2 via an upper electrode UE and a via contact V2.

Therefore, the MTJ elements and the cell transistors CT are connected in series between the bit lines BL1 and BL2. In the first embodiment, the two cell transistors CT carry a current to one MTJ element. For example, an MTJ element MTJ0 is driven by two cell transistors CT0 and CT1 adjacent obliquely with respect to the row direction. The cell transistors CT0 and CT1 correspond to word lines WL0 and WL1, respectively, and are connected to the bit line BL1 in one bit line pair BLP0. With this configuration, when a voltage is applied to the word lines WL0 and WL1, the two cell transistors CT0 and CT1 become conductive to thereby connect the MTJ element MTJ0 between the bit lines BL1 and BL2 of the bit line pair BLP0. A current can flow to the MTJ element MTJ0 by applying a voltage difference between the bit lines BL1 and BL2 of the bit line pair BLP0.

As shown in FIGS. 4A and 4B, the MRAM according to the first embodiment includes the silicon substrate 10 serving as a semiconductor substrate, a diffusion layer 20, the gate electrodes GC, the contact plugs CB2, an interlayer dielectric film ILD, the lower electrodes LE, the MTJ elements, sidewall films 40, the upper electrodes UE, and the via contacts V2.

On the silicon substrate 10, the diffusion layer 20 is provided. Each gate electrode GC (word line WL) is provided on the silicon substrate 10 via a gate dielectric film 25. The gate electrode GC and the diffusion layer 20 constitute a part of a plurality of cell transistors CT. FIGS. 4A and 4B show cross sections taken along one word line WL in the row direction, and thus do not show a diffusion layer to which the via contact V1 is connected. Nevertheless, it can be easily understood that a plurality of cell transistors CT are formed on the silicon substrate 10 by referring to FIGS. 3, 4A, and 4B.

As shown in FIG. 3, the contact plugs CB2 are buried in between the adjacent cell transistors CT. The contact plugs CB2 are electrically connected to the diffusion layer 20 between the adjacent cell transistors CT while keeping isolated from the gate electrode GC.

The interlayer dielectric film ILD buries spaces between the contact plugs CB2. Although not shown in FIGS. 4A and 4B, the interlayer dielectric film ILD also buries spaces between a plurality of contact plugs CB1. Furthermore, the interlayer dielectric film ILD buries spaces between the adjacent gate electrodes GC. The interlayer dielectric film ILD thereby electrically isolates the gate electrodes GC, the contact plugs CB1, and the contact plugs CB2 from one another.

As shown in FIGS. 4A and 4B, one lower electrode LE is connected to one of the two contact plugs CB2 adjacent in the row direction by the overlapping area A0. Conversely, the lower electrode LE is not connected to the other contact plug CB2.

As shown in FIGS. 4A and 4B, each MTJ element is not provided above any contact plugs CB2 but above the interlayer dielectric film ILD (element isolation region STI). Therefore, as shown in FIG. 3, the MTJ elements do not overlap with any contact plugs CB1 and CB2 as viewed from above a surface of the silicon substrate 10. However, the lower electrode LE provided under each MTJ element is connected to one contact plug CB2 by the overlapping area A0. Therefore, the MTJ element is electrically connected to one contact plug CB2 although being provided above the interlayer dielectric film ILD (element isolation region STI).

As shown in FIG. 4A, one sidewall film 40 covers a side surface of each MTJ element. As viewed from above the surface of the silicon substrate 10, an external edge of the sidewall film 40 is substantially identical in a shape to that of the lower electrode LE. In the first embodiment, the external edge of the sidewall film 40 and that of the lower electrode LE are generally circular and circular centers of the external edge of the sidewall film 40 and that of the lower electrode LE substantially mach each other as the external edge and the lower electrode LE are viewed from above the surface of the silicon substrate 10. Therefore, the sidewall film 40 is present between the external edge of the MTJ element and that of the lower electrode LE shown in FIG. 3. This follows that the sidewall film 40 like the lower electrode LE is provided to overlap with the contact plug CB2 in the overlapping area A0.

While the sidewall film 40 can entirely cover the side surface of the MTJ element as shown in FIG. 4A, the sidewall film 40 can alternatively cover only a part of the side surface of the MTJ element as shown in FIG. 4B. For example, the sidewall film 40 covers only a side surface of the upper magnetic layer (the free layer F, for example) present on the tunnel barrier film B. In this case, the sidewall film 40 is provided on a part of an upper surface of the tunnel barrier film B and not on a side surface of the lower magnetic layer (the pinned layer P, for example) present under the tunnel barrier film B. Because the sidewall film 40 is provided to function as a mask during processing of the lower electrode LE, the sidewall film 40 does not necessarily cover the entire side surface of the MTJ element. In this case, each of the tunnel barrier film B and the lower magnetic layer is substantially equal in a plane size to the lower electrode LE. However, an effective plane area that functions as the MTJ element is determined by the upper magnetic layer having a smaller area. Therefore, the MTJ element shown in FIG. 4B does not make any difference in characteristics and function from that shown in FIG. 4A. Alternatively, the sidewall film 40 can cover the side surfaces of the upper magnetic layer and the tunnel barrier film B. In this case, the sidewall film 40 is provided on an upper surface of the lower magnetic layer.

In the first embodiment, the lower magnetic layer of the MTJ element is the pinned layer P and the upper magnetic layer thereof is the free layer F. However, the positional relation between the pinned layer P and the free layer F may be opposite. That is, the lower magnetic layer of the MTJ element may be the free layer F and the upper electrode thereof may be the pinned layer P. In this case, the sidewall film 40 can cover only the side surface of the pinned layer P of the MTJ element or cover the side surfaces of the pinned layer P and the tunnel barrier film B. Even in the latter case, the sidewall film 40 can function as a mask during the processing of the lower electrode LE.

The upper electrode UE is provided on each MTJ element. The sidewall film 40 is provided on a side surface of the upper electrode UE, the side surface of the MTJ element, and a part of an upper surface of the lower electrode LE. The lower electrode LE is provided not only between a bottom of the MTJ element and the interlayer dielectric film ILD but also between the sidewall film 40 and one of the contact plugs CB2. The lower electrode LE thereby electrically connects the lower end of the MTJ element to the contact plug CB2.

The via contact V2 is provided on each upper electrode UE and electrically connects the upper electrode UE to the bit line BL2.

When aspect ratios of the contact plugs CB1 and CB2 increase with the progress of downscaling of the MRAM, voids or seams 30 occur in the contact plugs CB as shown in FIGS. 4A and 4B.

In the MRAM according to the first embodiment, the MTJ elements do not overlap with the contact plugs CB2 in a plan layout as viewed from above the surface of the silicon substrate 10. Each MTJ element is formed on the element isolation region STI and apart from the two contact plugs CB2 adjacent in the row direction by gaps G1 and G2 (see FIGS. 3, 4A, and 4B), respectively. Therefore, the voids or seams 30 do not affect the MTJ element. When the MTJ element is provided on the contact plugs CB2, stepped parts resulting from the voids or seams 30 are possibly generated in the MTJ element. These stepped parts cause degradation in characteristics of the MTJ elements.

In contrast, no stepped parts are generated in the MTJ element according to the first embodiment because the voids or seams 30 do not affect the MTJ element. Therefore, this can suppress degradation in the characteristics of the MTJ element.

On the other hand, the lower electrode LE is provided on the gaps G1 and G2, and is thereby connected to the contact plug CB2 near the gap G1. As a result, the lower electrode LE can keep the electrical connection between the lower end of the MTJ element and one of the contact plugs CB2. The MTJ element and the cell transistor CT are thereby connected between the paired bit lines BL1 and BL2 and can normally operate.

The MRAM configured as described above is formed by the following manufacturing method.

Figure 5:
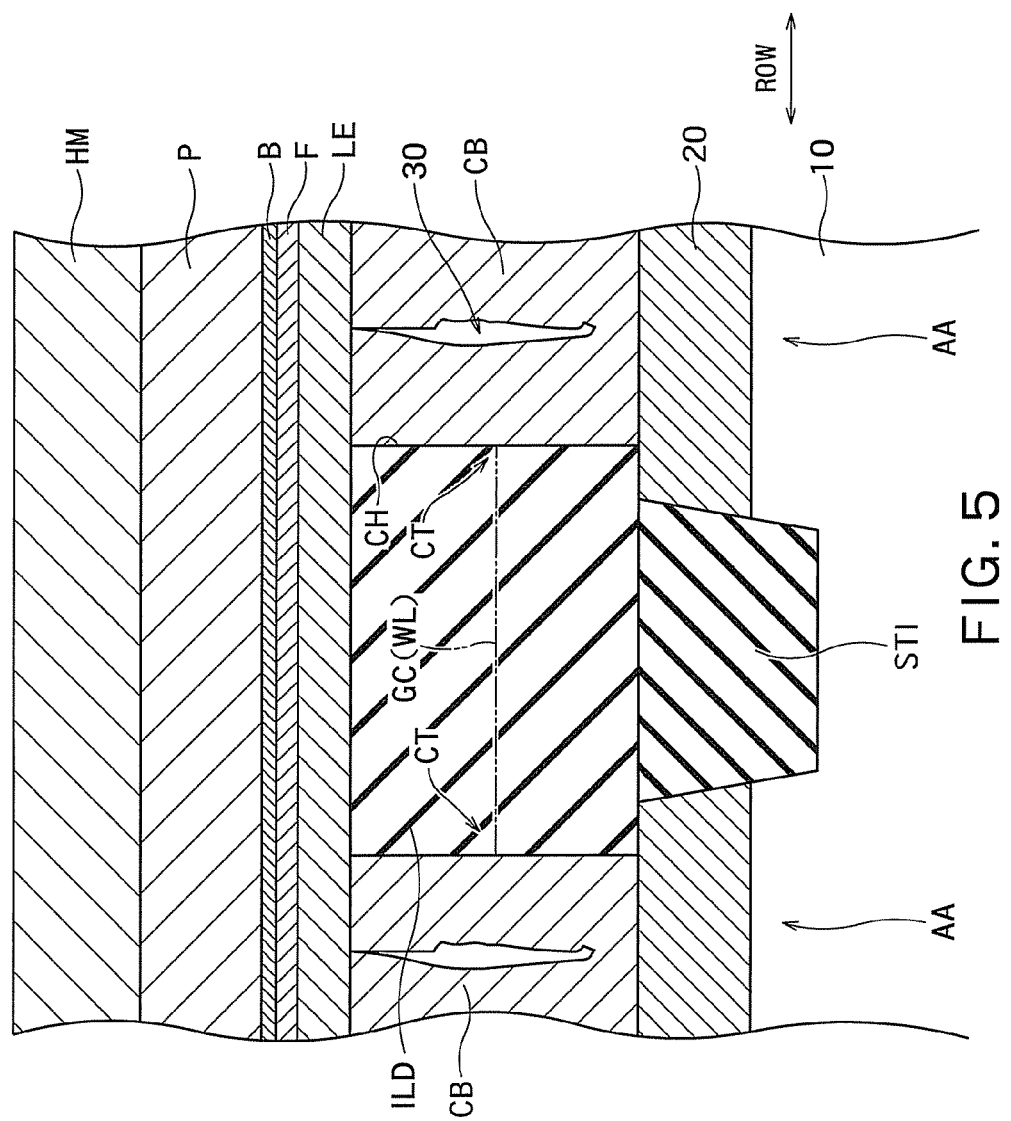
FIGS. 5 to 9 are cross-sectional views showing a method of manufacturing the MRAM according to the first embodiment.

FIGS. 5 to 9 are cross-sectional views showing a method of manufacturing the MRAM according to the first embodiment. First, the cell transistors CT are formed on the silicon substrate 10. After forming the element isolation regions STI, the cell transistors CT are formed in the respective active areas AA. The cell transistors CT can be formed by the same method as a well-known method for forming transistors. FIG. 5 shows the diffusion layer 20 and the gate electrode GC of each cell transistor CT. The diffusion layer 20 is either a source or a drain. The gate electrode GC is indicated by a chain line because being arranged offset from the contact plugs CB in a perpendicular direction (a column direction) to the sheet of FIG. 5.

Next, the interlayer dielectric film ILD is deposited so as to cover the gate electrodes GC and the gaps between the gate electrodes GC. The interlayer dielectric film ILD is planarized by CMP (Chemical Mechanical Polishing).

Using lithography and RIE (Reactive Ion Etching), contact holes CH for the contact plugs CB are formed in the interlayer dielectric film ILD. A metallic material (tungsten, for example) is deposited in the contact holes CH by CVD (Chemical Vapor Deposition). Generally, the adjacent cell transistors CT are formed to have a small distance and the gate electrodes GC (word lines WL) are formed thick so as to reduce resistances of the gate electrodes GC (word lines WL). Therefore, an aspect ratio of a trench of each contact hole CH is high. As a result, the contact holes CH are not completely filled with the metallic material and the voids or seams 30 tend to be generated in the contact holes CH. Furthermore, small stepped parts possibly occur between the interlayer dielectric film ILD and the metallic material.

Next, the metallic material is planarized by the CMP and the adjacent contact plugs CB are electrically isolated from one another. The contact plugs CB are formed to be isolated from one another, to be connected to the diffusion layer 20, and to be isolated from the gate electrodes GC. Thereafter, the material of the lower electrodes LE is deposited. Examples of the material of the lower electrodes LE include Ta, Pt, Ir, Ru, Pd, W, Ti, Al, nitride of Ta, Pt, Ir, Ru, Pd, W, Ti, or Al, or composites thereof.

Materials of each MTJ element are then deposited on the lower electrode LE. For example, the material of the recording layer F, that of the tunnel barrier film B, and that of the pinned layer P are deposited on the lower electrode LE in this order. Examples of the materials of the recording layer F and the pinned layer P are magnetic materials including Co, Fe, Ni, Pt, Fe, Pd, B, Ta, Dy, Tv, or Cr. The material of the tunnel barrier film B is magnesium oxide, for example.

The material of a hard mask HM is then deposited on the materials of each MTJ element. As a result, the structure shown in FIG. 5 is obtained. For example, the hard mask HM is made of a material such as $SiO_2$, SiN, Ta, $TiAl_xN_y$, TaN, TiN, WN, W, or $Al_2O_3$ and is formed as a single-layer film or multilayer film. When the hard mask HM is the single-layer film, the material of the hard mask HM is preferably a conductive material (for example, Ta, $TiAl_xN_y$, TaN, WN, W, or TiN) so that the hard mask HM can be used as the upper electrodes UE shown in FIGS. 4A and 4B. When the hard mask HM is the multilayer film, the conductive material is then deposited on at least the MTJ element and an insulating material (for example, $SiO_2$, SiN, or $Al_2O_3$) is deposited on the conductive material. The insulating material of the hard mask HM is eliminated when the MTJ element is etched. In the first embodiment, as the material of the hard mask HM, either a multilayer film of $SiO_2$, SiN, and Ta formed by plasma TEOS or that of $SiO_2$, Ta, and TiAlN is adopted. In this case, Ta or TiAlN is deposited first on the materials of the MTJ element and SiN and $SiO_2$ are then deposited on the Ta or TiAlN.

Figure 6:
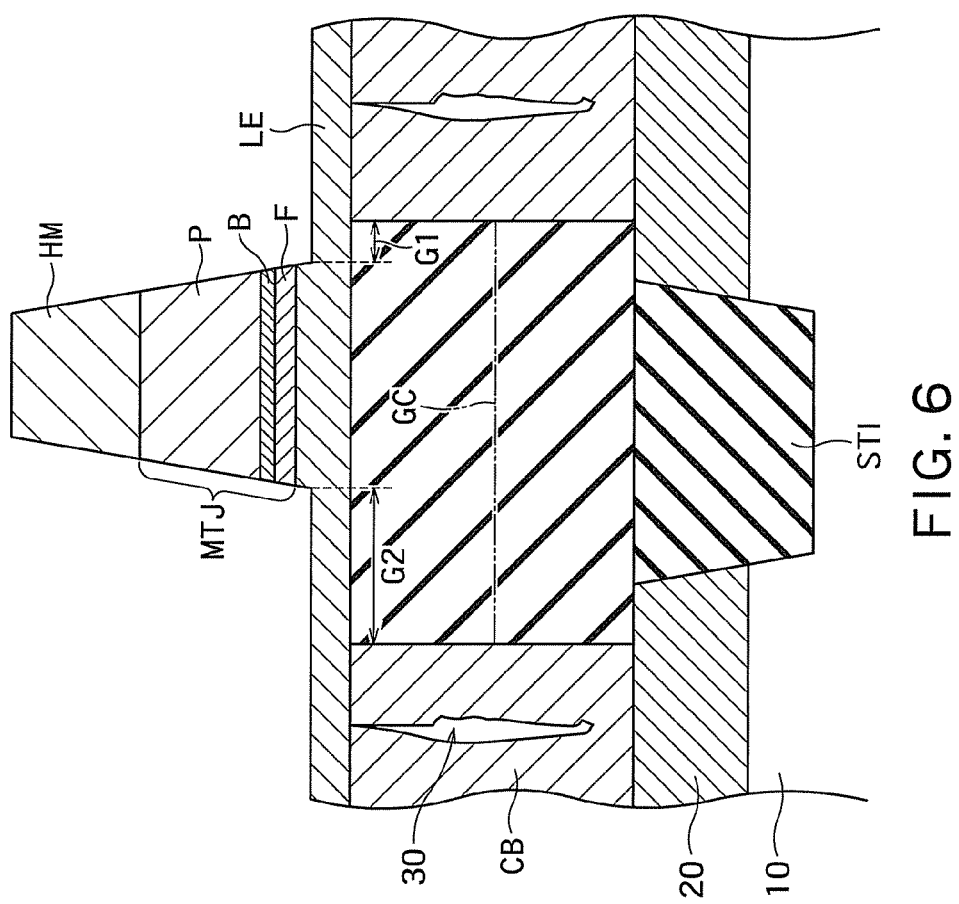

Next, the hard mask HM is processed by the lithography and RIE. Using the hard mask HM as a mask, the materials of each MTJ element (the materials of the pinned layer P, the tunnel barrier film B, and the recording layer F) are etched continuously until the upper surface of the lower electrode LE is exposed. As a result, the structure shown in FIG. 6 is obtained. In this etching process, the insulating material deposited on an upper portion of the hard mask HM is eliminated. Therefore, the hard mask HM is hereinafter referred to as "upper electrode UE".

The materials of each MTJ element can be etched by the RIE, high temperature RIE at 150° C. to 300° C., or IBE (Ion Beam Etching). Alternatively, the materials of the MTJ element can be etched by a combination of a plurality of methods including the RIE, the high temperature RIE, and the IBE. Furthermore, by performing an $O_2$ plasma treatment at a low temperature from a room temperature to 200° C. on the materials of the MTJ element after processing the materials of the MTJ element, it is possible to recover the MTJ element from damage and to reduce leakage current of the tunnel barrier film B.

When the structure shown in FIG. 4B is to be formed, the free layer F serving as the upper magnetic layer among the materials of each MTJ element is etched using the hard mask HM as a mask until a surface of the tunnel barrier film B is exposed. In this case, the tunnel barrier film B can be used as an etching stopper. The sidewall film 40 to be described later can be left only on a side surface of the free layer F. Furthermore, the free layer F and the tunnel barrier film B among the materials of each MTJ element are etched until the surface of the pinned layer P serving as the lower magnetic layer is exposed. In this case, the sidewall film 40 is left only on the side surfaces of the free layer F and the tunnel barrier film B.

As shown in FIG. 6, as viewed from above the surface of the silicon substrate 10, the hard mask HM and each MTJ element are formed on the material of the lower electrode LE so as to overlap not with the contact plugs CB but with the interlayer dielectric film ILD. That is, the hard mask HM and the MTJ element are formed on the interlayer dielectric film ILD (element isolation region STI) and not on the contact plugs CB. Therefore, the MTJ element is free from the influence of the voids or seams 30.

Furthermore, the hard mask HM and each MTJ element are arranged offset to one of the two contact plugs CB adjacent in the row direction. Therefore, in the first embodiment, the MTJ element is away from one of the contact plugs CB by the gap G1 and away from the other contact plug CB by the gap G2 (G2>G1). This arrangement enables the electrical connection to be kept between the MTJ element and one contact plug CB and the electrical isolation to be kept between the MTJ element and the other contact plug CB. The side surface of the MTJ element is almost forward tapered after being processed. Therefore, an external edge of the hard mask HM is present inside the external edge of the MTJ element as viewed from above the surface of the silicon substrate 10.

The material of the sidewall film 40 is then deposited on each MTJ element and each lower electrode LE. The material of the sidewall film 40 is an insulating material, and the sidewall film 40 is, for example, a film made of silicon nitride, aluminum oxide, zirconium oxide, or a film made of a composite of silicon nitride, aluminum oxide, and zirconium oxide. In the first embodiment, for example, the sidewall film 40 is a silicon nitride film or the like deposited by PVD (Plasma Vapor Deposition), ALD (Atomic Layer Deposition), or PEALD (Plasma Enhanced Atomic Layer Deposition).

Figure 7:
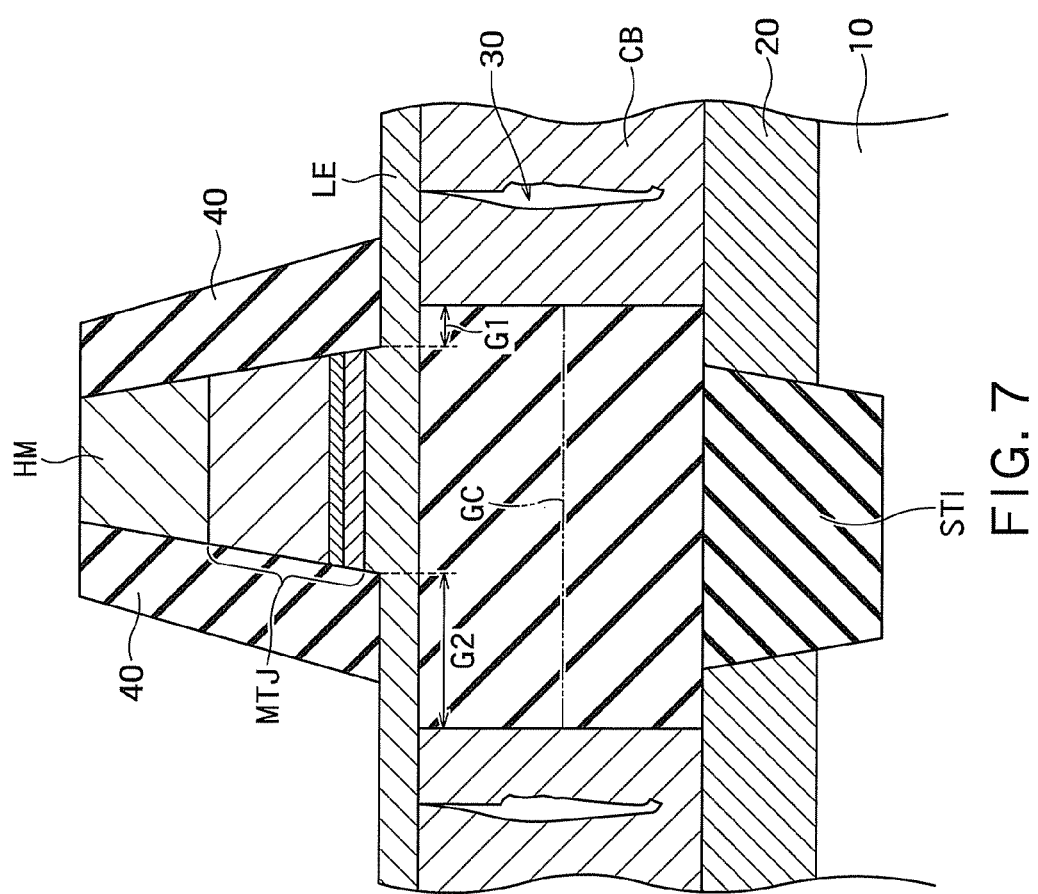

Thereafter, the material of the sidewall film 40 is anisotropically etched by the RIE, thereby leaving the sidewall film 40 only on the side surface of each MTJ element. At this time, the sidewall film 40 is formed to overlap with both one of the contact plugs CB and the interlayer dielectric film ILD as viewed from above the surface of the silicon substrate 10. Also, the sidewall film 40 is formed not to overlap with the other one of the contact plugs CB as viewed from above the surface of the silicon substrate 10. Therefore, it is preferable to deposit the material of the sidewall film 40 to be thicker than the gap G1 and thinner than the gap G2. The sidewall film 40 is also etched so that the sidewall film 40 is left on one contact plug CB and not on the other contact plug CB. As a result, the structure shown in FIG. 7 is obtained.

Figure 8:
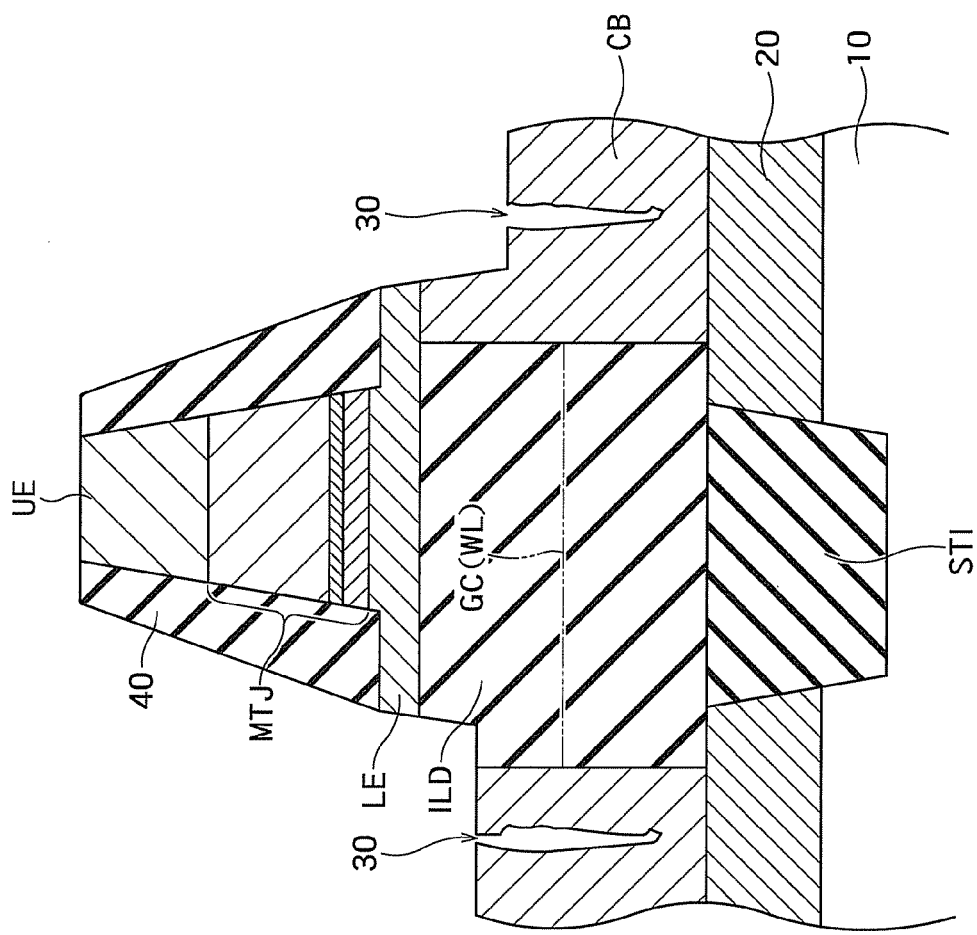

Next, using the sidewall film 40 and the upper electrode UE as a mask, the material of the lower electrode LE is processed by the RIE. At this time, upper portions of the contact plugs CB are also over-etched. As a result, the structure shown in FIG. 8 is obtained.

When the structure shown in FIG. 4B is to be formed, the materials of the tunnel barrier film B, the pinned layer P, and the lower electrode LE are processed using the sidewall film 40 and the upper electrode UE as a mask. In this case, the pinned layer P is formed to be substantially equal in the plane size to the lower electrode LE; however, no problem occurs because the effective plane area that functions as the MTJ element is determined by the upper magnetic layer (the free layer F) having a smaller area. When the sidewall film 40 is provided on the side surfaces of the free layer F and the tunnel barrier film B, the materials of the pinned layer P and the lower electrode LE are processed in the etching process. Most parts of the lower electrode LE overlap with the interlayer dielectric film ILD as the lower electrode LE is viewed from above the surface of the silicon substrate 10. Therefore, most parts of the lower electrode LE are provided between the bottom of each MTJ element and the interlayer dielectric film ILD. On the other hand, a part of the lower electrode LE overlaps with one of the two contact plugs CB adjacent in the row direction but not with the other contact plug CB as the lower electrode LE is viewed from above the surface of the silicon substrate 10. Therefore, a part of the lower electrode LE is provided between the sidewall film 40 and one of the contact plugs CB but not between the sidewall film 40 and the other contact plug CB. The overlapping portion between the lower electrode LE and the contact plug CB is the overlapping area A0 shown in FIG. 3. In this way, the lower electrode LE is formed to bury one gap G1 without any overlapping between the MTJ element and the other contact plug CB while the MTJ element is away from the two contact plugs CB by the gaps G1 and G2, respectively. That is, the lower electrode LE extends laterally (in the row direction) from the lower end of the MTJ element and electrically connects the lower end of the MTJ element to one of the contact plugs CB. The lower end of the MTJ element is thereby electrically connected to the one contact plug CB via the lower electrode LE.

The lower electrode LE is processed in a self-aligned manner with the sidewall film 40 used as a mask. Therefore, as viewed from above the surface of the silicon substrate 10, the sidewall film 40 substantially matches the lower electrode LE in an external shape. In the first embodiment, the sidewall film 40 and the lower electrode LE are generally circular and substantially match each other in the center. Similarly, the MTJ element is generally circular and substantially matches the lower electrode LE in the center.

The sidewall film 40 is used as a mask and, after processing the lower electrode LE, functions as a sidewall-protection insulating film that blocks oxygen, hydrogen, and the like. To block oxygen, hydrogen, and the like, the silicon nitride film, the aluminum oxide film, the zirconium oxide film, or the composite film of the silicon nitride film, the aluminum oxide film, and the zirconium oxide film is effective as the sidewall film 40. Furthermore, the sidewall film 40 effectively functions to block oxygen, hydrogen, and the like because being provided on the side surface of the upper electrode UE, the side surface of the MTJ element, and a part of the upper surface of the lower electrode LE.

In the first embodiment, the sidewall film 40 is formed by depositing the silicon nitride film by sputtering, and depositing again a silicon nitride film by the ALD that can ensure good coverage. The silicon nitride film formed by the sputtering can suppress damage to the MTJ element during the deposition of the silicon nitride film by the ALD or PeALD. Therefore, preferably, portions of the sidewall film 40 in direct contact with each MTJ element are formed by the sputtering.

Figure 9:
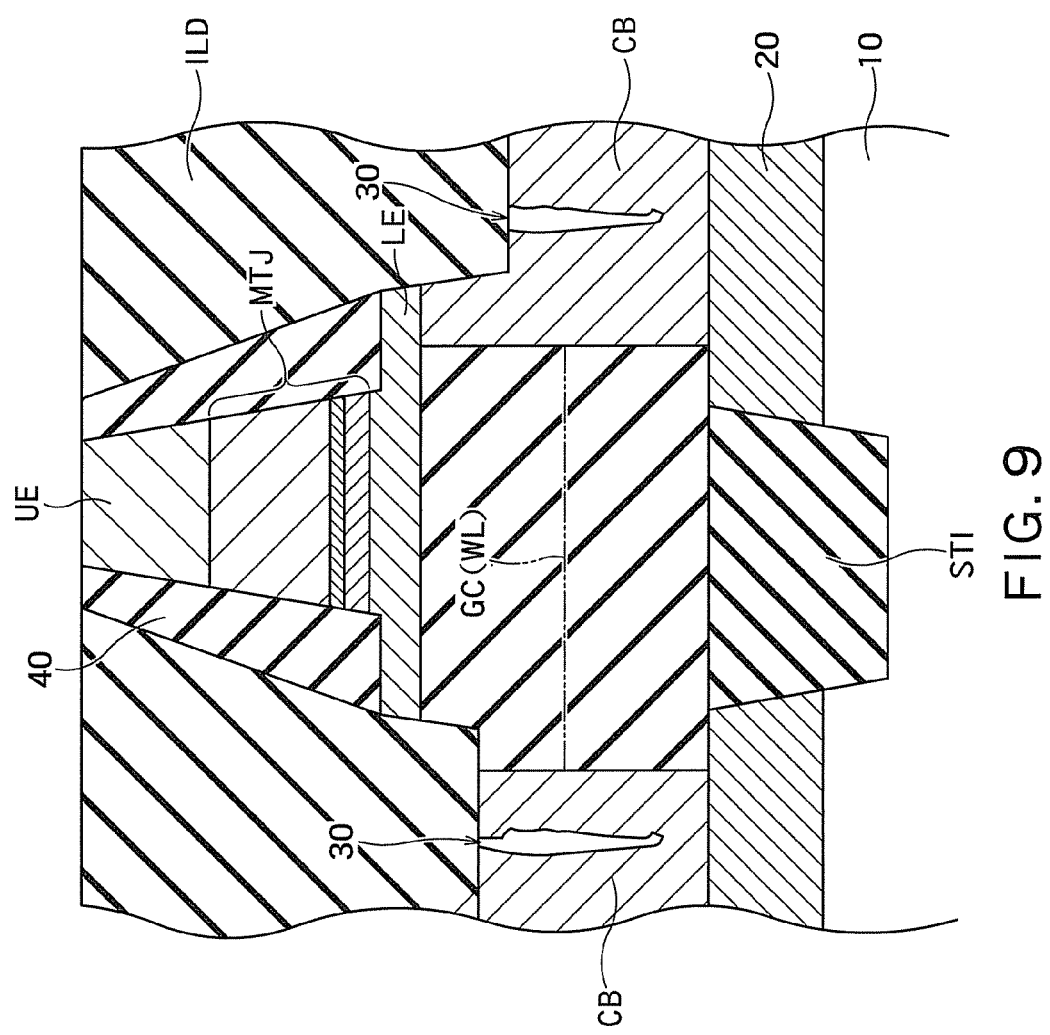

Next, the interlayer dielectric film ILD is further deposited on the sidewall film 40, the upper electrode UE, the lower electrode LE, and the contact plugs CB. The interlayer dielectric film ILD is then etched back until the surface of the upper electrode UE is exposed. At this time, the upper electrode UE and the sidewall film 40 function as an etching stopper. As a result, the structure shown in FIG. 9 is obtained.

Next, as shown in FIGS. 4A and 4B, an intermediate plug electrode is further formed on the upper electrode UE and an interlayer dielectric film ILD2 is deposited to cover the upper electrode UE. For example, the intermediate plug electrode is made of titanium nitride and functions as a part of the upper electrode UE. Thereafter, the via contacts V1 and V2 are formed and wirings or the like such as bit lines BL1 and BL2 are formed, thereby completing the MRAM according to the first embodiment. Note that one via contact V1 is connected to the diffusion layer opposite to the diffusion layer 20 across the gate electrode GC of each cell transistor CT.

According to the first embodiment, after the hard mask HM and the MTJ elements are processed by the lithography and the RIE, the lower electrodes LE are processed in a self-aligned manner with the sidewall films 40 used as a mask. Therefore, only one lithographic process is required to perform to process the upper electrodes UE, the MTJ elements, and the lower electrodes LE. Therefore, the MRAM according to the first embodiment can be formed by a manufacturing method simpler than conventional methods.

Meanwhile, in the MRAM according to the first embodiment, each upper electrode UE and each MTJ element are formed offset to one of the two adjacent contact plugs CB while being provided above the interlayer dielectric film ILD. With this formation, the upper electrode UE and the MTJ element can be formed so that the MTJ element does not overlap with the contact plugs CB and so that the lower electrode LE overlaps with one of the contact plugs CB as viewed from above the surface of the silicon substrate 10.

In this way, the entirety of the MTJ elements is provided above the interlayer dielectric film ILD (element isolation regions STI). Therefore, even when the MRM is downscaled, the MTJ elements are free from the influence of the seams or voids 30 in the contact plugs CB. Therefore, the MRAM according to the first embodiment can suppress degradation in the characteristics of the MTJ elements.

Furthermore, because each MTJ element is formed offset to one of the two adjacent contact plugs CB, the lower end of the MTJ element can keep the electrical connection to one of the contact plugs CB via the lower electrode LE. The MRAM according to the first embodiment can thereby normally operate as a memory.

Because the upper electrodes UE, the MTJ elements, and the lower electrodes LE are formed by one lithographic process, all shapes of external edges of the upper electrodes UE, the MTJ elements, the sidewall film 40, and the lower electrodes LE are identical, and centers thereof substantially match one another.

In the first embodiment, a protection insulating film (not shown) can be deposited again after processing the lower electrodes LE. This can block hydrogen, water, and oxygen in later processes, so that the characteristics of the MTJ elements can be further improved. In this case, the protection insulating film can be made of the same material as that of the sidewall films 40.

Second Embodiment

Figure 10:
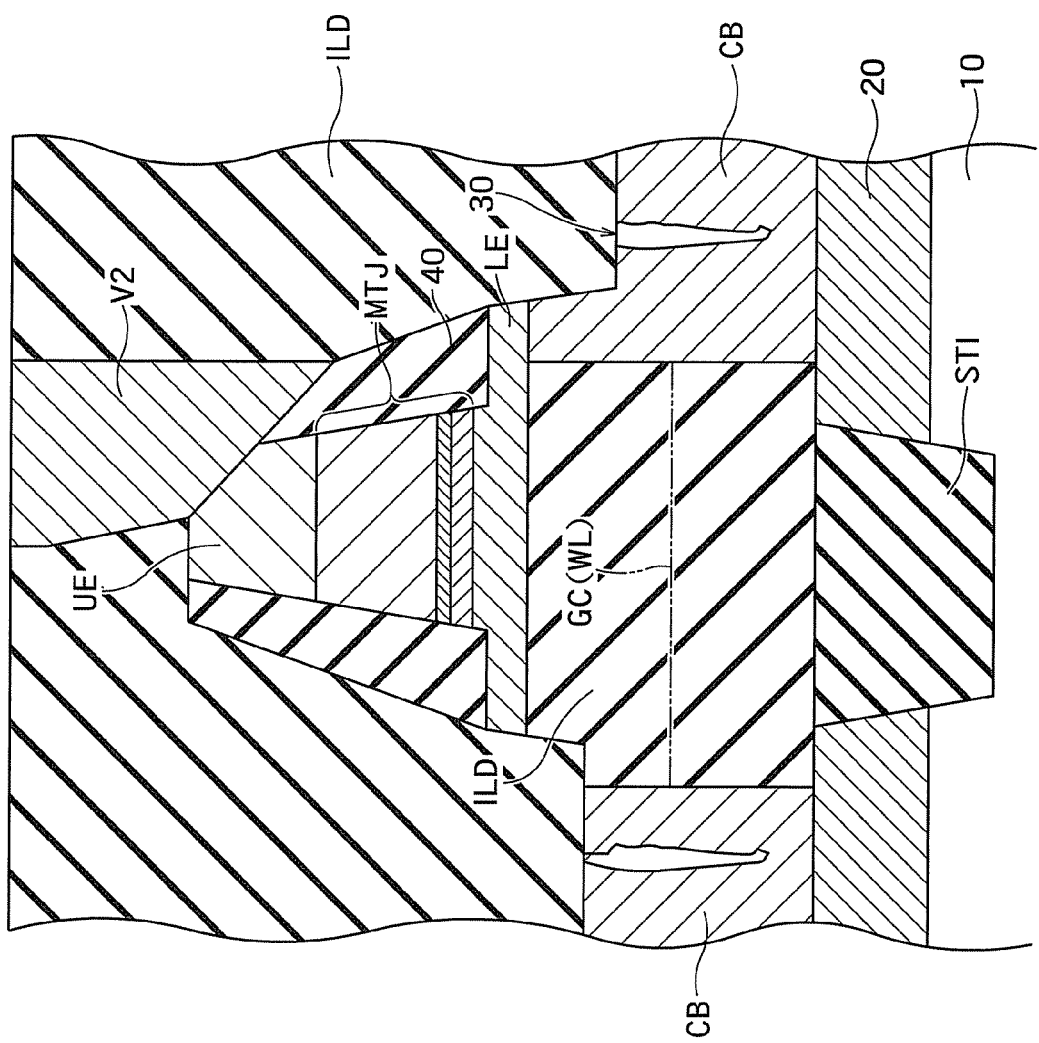
FIG. 10 is a cross-sectional view of an MRAM according to a second embodiment.

FIG. 10 is a cross-sectional view of an MRAM according to a second embodiment. The second embodiment differs from the first embodiment in that the intermediate plug electrode is not provided between the via contact V2 and the upper electrode UE. Other configurations of the second embodiment can be identical to corresponding ones of the first embodiment.

In the second embodiment, each via contact V2 is directly connected onto the upper electrode UE.

In this case, a contact hole of the via contact V2 is possibly formed misaligned with respect to the upper electrode UE, as shown in FIG. 10. However, in the second embodiment, the sidewall film 40 covers the side surfaces of each upper electrode UE and each MTJ element. Furthermore, the sidewall film 40 is formed thick to some extent so as to secure the overlapping area A0 shown in FIG. 3. Therefore, even when the contact hole of the via contact V2 is slightly misaligned, the sidewall film 40 can protect each MTJ element.

Furthermore, according to the second embodiment, the via contact V2 can be directly connected onto each upper electrode UE without via the intermediate plug electrode. Therefore, in a method of manufacturing the MRAM according to the second embodiment, the process of forming the intermediate plug electrodes can be excluded from the method of manufacturing the MRAM according to the first embodiment. Therefore, the method of manufacturing the MRAM according to the second embodiment is simpler than that according to the first embodiment because it is unnecessary to form the intermediate plug electrodes. The second embodiment can also achieve effects of the first embodiment.

Third Embodiment

Figure 11:
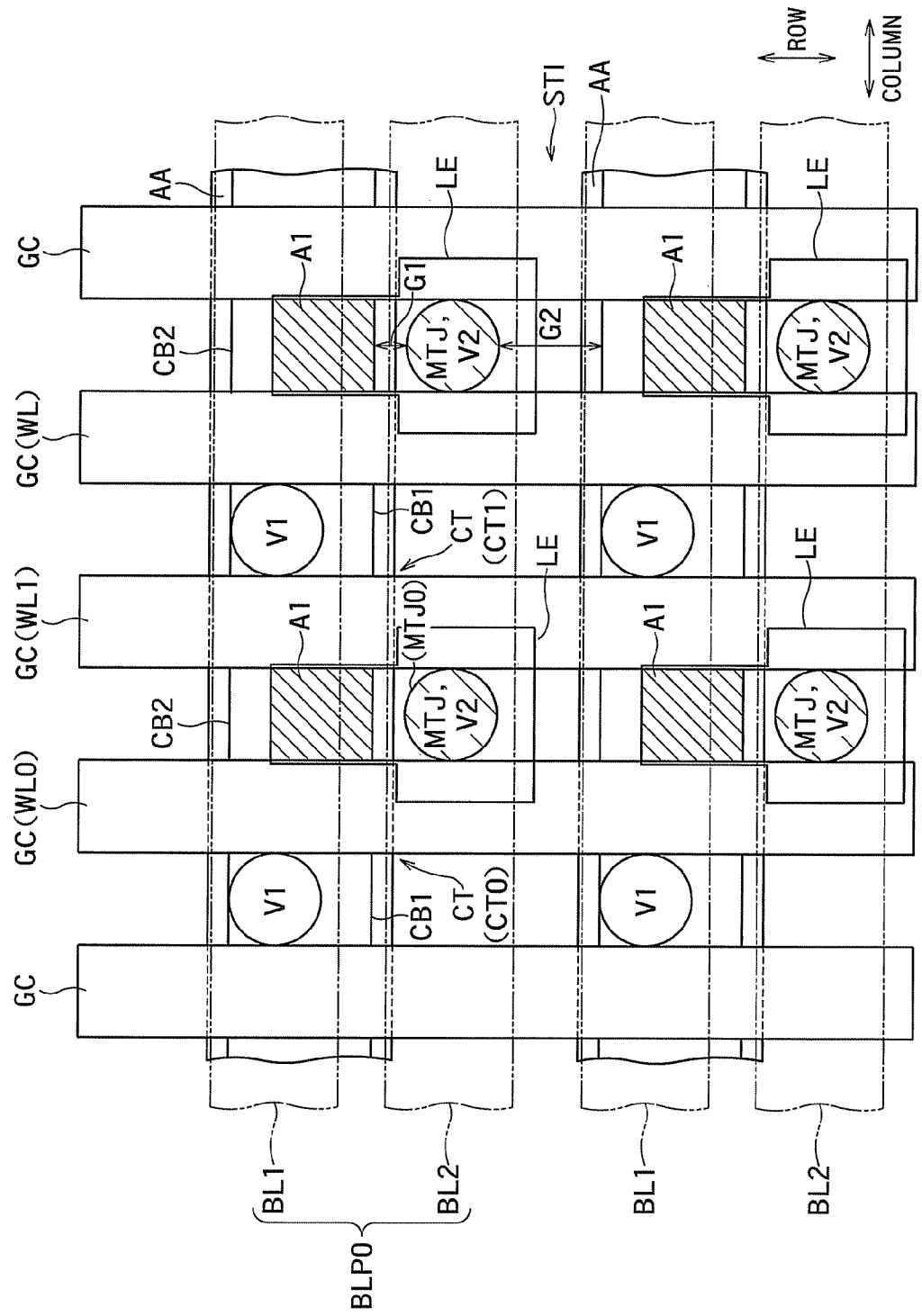
FIG. 11 is a partial plan view of the memory cell array 11 in an MRAM according to a third embodiment.

FIG. 11 is a partial plan view of the memory cell array 11 in an MRAM according to a third embodiment. The third embodiment differs from the first embodiment in that the lower electrodes LE are formed into a convex shape. Other configurations of the third embodiment can be identical to corresponding ones of the first embodiment. However, the manufacturing method of the MTJ elements and the lower electrode LE is different from that of the first embodiment.

In the third embodiment, each lower electrode LE protrudes toward one of the contact plugs CB connected to the lower electrode LE in the row direction. Therefore, a connection area between the lower electrode LE and the contact plug CB (an area of the overlapping area A1) is larger. This can ensure that the lower electrode LE can electrically connect the contact plug CB to the lower end of each MTJ element.

Furthermore, in the third embodiment, the entirety of the MTJ elements is provided above the interlayer dielectric film ILD (element isolation regions STI). Therefore, even when the MRM is downscaled, the MTJ elements are free from the influence of the seams or voids 30 in the contact plugs CB. Therefore, the MRAM according to the third embodiment can also achieve effects of the first embodiment.

However, the shape of the lower electrodes LE is different from that of the MTJ elements in a plan layout. Therefore, in the third embodiment, it is necessary to process the lower electrodes LE using a mask different from the hard mask HM used during the formation of the MTJ elements.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a semiconductor substrate;
   a plurality of cell transistors on the semiconductor substrate;
   a plurality of contact plugs each buried between the adjacent cell transistors, and directly and electrically connected to a diffusion layer between the adjacent cell transistors;
   an interlayer dielectric film burying gaps between the plurality of the contact plugs;
   a storage element provided not above the contact plugs but above the interlayer dielectric film;
   a sidewall film covering at least a part of a side surface of the storage element, and overlapping with one of the contact plugs as viewed from above a surface of the semiconductor substrate; and
   a lower electrode between a bottom of the storage element and the interlayer dielectric film and between the sidewall film and one of the contact plugs, the lower electrode electrically connecting the storage element to one of the contact plugs,
   wherein, as the storage element and the lower electrode are viewed from above the surface of the semiconductor substrate, an external edge of the storage element is substantially equal in a shape to an external edge of the lower electrode, and
   centers of the storage element and the lower electrode substantially match one another.

2. The device of claim 1, wherein, as the sidewall film and the lower electrode are viewed from above the surface of the semiconductor substrate, an external edge of the sidewall film is substantially equal in a shape to the external edge of the lower electrode.

3. The device of claim 2, wherein, as the sidewall film and the lower electrode are viewed from above the surface of the semiconductor substrate, the sidewall film and the lower electrode are generally circular, and a center of the sidewall film substantially matches the center of the lower electrode.

4. The device of claim 1, wherein, as the storage element and the lower electrode are viewed from above the surface of the semiconductor substrate, the storage element and the lower electrode are generally circular, and a center of the storage element substantially matches a center of the lower electrode.

5. The device of claim 1, wherein
as the storage element and the contact plugs are viewed from above the surface of the semiconductor substrate, the storage element is away from one of the contact plugs by a gap without overlapping with the contact plug, and
the lower electrode is provided on the gap.

6. The device of claim 1, wherein the sidewall film is a film made of at least one of silicon nitride, aluminum oxide, and zirconium oxide, or a composite film of silicon nitride, aluminum oxide, and zirconium oxide.

7. The device of claim 2, wherein the sidewall film is a film made of at least one of silicon nitride, aluminum oxide, and zirconium oxide, or a composite film of silicon nitride, aluminum oxide, and zirconium oxide.

8. The device of claim 1, further comprising an upper electrode on the storage element, wherein
the sidewall film is provided on a side surface of the upper electrode, a side surface of the storage element, and a part of an upper surface of the lower electrode.

9. The device of claim 2, further comprising an upper electrode on the storage element, wherein
the sidewall film is provided on a side surface of the upper electrode, a side surface of the storage element, and a part of an upper surface of the lower electrode.

10. The device of claim 1, wherein
the storage element comprises two magnetic layers and a tunnel barrier film provided between the two magnetic layers, and
the sidewall film is provided on an upper surface of the tunnel barrier film and on a side surface of one of the magnetic layers on the tunnel barrier film.

11. The device of claim 2, wherein
the storage element comprises two magnetic layers and a tunnel barrier film provided between the two magnetic layers, and
the sidewall film is provided on an upper surface of the tunnel barrier film and on a side surface of one of the magnetic layers on the tunnel barrier film.

12. The device of claim 8, wherein the upper electrode is a film made of at least one of Ta, titanium nitride, tungsten nitride, tantalum nitride, Pt, Ir, Ru, and Pd, or a composite film of Ta, titanium nitride, tungsten nitride, tantalum nitride, Pt, Ir, Ru, and Pd.

* * * * *